United States Patent [19]

Ito

[11] Patent Number: 5,155,449

[45] Date of Patent: Oct. 13, 1992

[54] FET BUFFER AMPLIFIER

[75] Inventor: Takeshi Ito, Kawasaki, Japan

[73] Assignee: Kikusui Electronics Corporation, Kanagawa, Japan

[21] Appl. No.: 755,065

[22] Filed: Sep. 5, 1991

[30] Foreign Application Priority Data

Oct. 26, 1990 [JP] Japan .................................. 2-287214

[51] Int. Cl.⁵ .............................................. H03F 3/16
[52] U.S. Cl. .................................... 330/277; 330/293; 330/300; 330/311
[58] Field of Search .................. 330/70, 71, 277, 269, 330/293, 311, 300, 294

[56] References Cited

U.S. PATENT DOCUMENTS 2,358,428  9/1944  White ..................................... 330/70
4,761,615  8/1988  Maloberti et al. .................. 330/277

OTHER PUBLICATIONS

Fjarlie, "Photo Diode Preamplifier Systems: Low--Wise Positive-Feedback", *Applied Optics*, vol. 16, No. 2, pp. 385-392, Feb. 1977.

Oswald, "Class B Emitter-Follower", *IBM Technical Disclosure Bulletin*, vol. 8, No. 10, Mar. 1966, pp. 1447-1448.

*Primary Examiner*—James B. Mullins
*Attorney, Agent, or Firm*—Finnegan, Henderson, Farabow, Garrett and Dunner

[57] ABSTRACT

An FET buffer amplifier having a serially connected input FET and bias current FET. The drain or source current of the input FET is detected by a detection resistor and the detected voltage is negatively fed back to the gate of the bias current FET so that the source current of the input FET is maintained at a fixed value. This can achieve a low output impedance, high input impedance, wideband buffer amplifier with a simple circuit.

4 Claims, 5 Drawing Sheets

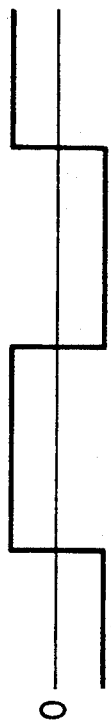
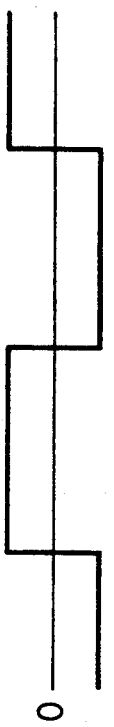
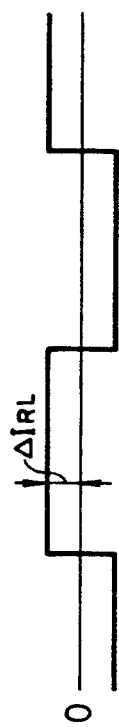
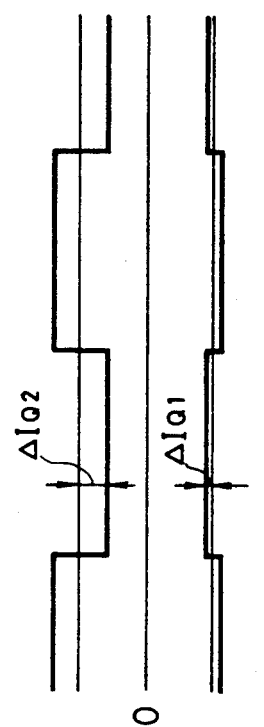
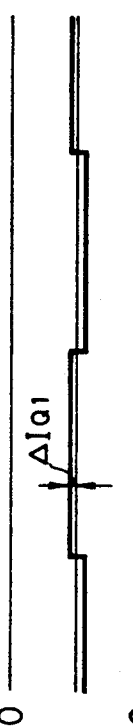
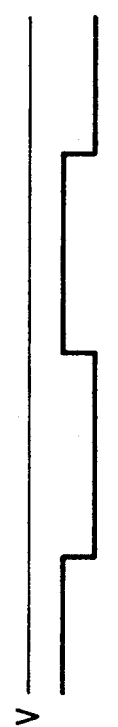
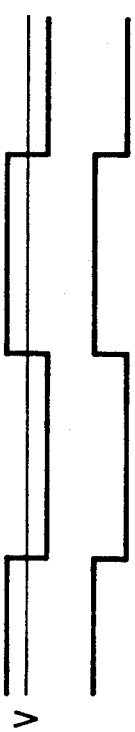
FIG.7A  INPUT VOLTAGE Vin
FIG.7B  OUTPUT VOLTAGE Vout
FIG.7C  LOAD CURRENT $I_{RL}$
FIG.7D  Q2 DRAIN CURRENT $I_{Q2}$
FIG.7E  Q1 DRAIN CURRENT $I_{Q1}$
FIG.7F  DETECTED VOLTAGE $V_{R1}$
FIG.7G  Q2 GATE VOLTAGE
FIG.7H  Q2 SOURCE VOLTAGE

FET BUFFER AMPLIFIER

BACKGROUND OF THE INVENTION

1. Field of the Invention

The present invention relates to an FET buffer amplifier preferably applied to an input stage, a sample-and-hold circuit, sweep circuit or the like of measuring apparatuses such as an oscilloscope.

2. Description of the Prior Art

FIGS. 1 and 2 are circuit diagrams showing arrangements of conventional FET buffer amplifiers.

FIG. 1, an input FET Q1 is serially connected with a bias current FET Q2. In this example, n-channel depletion mode FETs are used as the input FET Q1 and bias current FET Q2, and the source of the input FET Q1 and the drain of the bias current FET Q2 are connected. The drain of the input FET Q1 is connected to a reference voltage source +V, and the gate thereof is connected to an input terminal 1 to which an input voltage Vin is applied. The gate and source of the bias current FET Q2 are connected to a voltage source −V to configure a current source. A voltage at the connecting point of the input FET Q1 and the bias current FET Q2 is produced via an output terminal 2 as an output voltage Vout.

In the buffer amplifier, the bias current, which is produced by the bias current FET Q2 whose gate and source are connected to the voltage source −V, flows through the input FET Q1. Consequently, the gate-to-source voltage of the input FET Q1 becomes approximately zero. As a result, a source follower circuit can be achieved having a small offset voltage across the input terminal 1 and output terminal 2, and small temperature drift.

On the other hand, in the circuit shown in FIG. 2, a resistor R3 is connected between the source of the input FET Q1 and the drain of the bias current FET Q2, and a resistor R4 is connected between the source and gate of the bias current FET Q2. These resistors are for accommodating variations in FETs.

FIGS. 3A-3D are diagrams illustrating waveforms of various portions of the circuit shown in FIG. 2. When the input voltage Vin is zero, then $I_{Q1} = I_{Q2}$, where $I_{Q1}$ and $I_{Q2}$ are the currents flowing through the input FET Q1 and the bias current FET Q2, respectively. When the input voltage Vin changes from zero, the load current $I_{RL}$ flows as shown in FIG. 3C so that $I_{Q1} = I_{Q2} + I_{RL}$. In other words, the current change $\Delta I_{Q1}$ of the input FET Q1 is expressed as $\Delta I_{Q1} = I_{RL}$. Accordingly, the output voltage Vout decreases by an amount indicated by oblique lines of FIG. 3B, which is expressed as (R3 + source resistance of the input FET Q1) × $\Delta I_{Q1}$. Here, the source resistance of the input FET Q1 is approximately equal to the reciprocal of the mutual conductance of the input FET Q1, and is usually on the order of several hundred ohms. Accordingly, the decrease in the output voltage Vout is a considerable amount.

To prevent such decrease in the output voltage, an emitter follower circuit is usually added as a post amplifier of the buffer amplifier in prior art.

The emitter follower circuit, however, has a direct current offset voltage across the input and output terminals in the form of a base-to-emitter voltage VBE. Since the offset voltage is susceptible to temperature drift, a circuit for correcting the drift is needed. This presents a problem that the entire arrangement of the buffer amplifier becomes more complicated.

SUMMARY OF THE INVENTION

Accordingly, it is an object of the present invention to provide an FET buffer amplifier having a simple circuit arrangement that can overcome the above-mentioned problems, and has a high input impedance and a low output impedance.

In the present invention, an FET buffer amplifier comprises:
  a first voltage source;
  a second voltage source;
  an input FET whose gate terminal is connected to an input terminal to which an input signal is applied;
  a bias current FET whose first terminal is connected to a second terminal of the input FET and to an output terminal from which an output signal is produced, whose second terminal is connected to the second voltage source, and whose gate is connected to the second voltage source via a first resistor;
  a detection resistor connected between the first voltage source and a first terminal of the input FET to detect a current flowing through the input FET, and to convert the current into a voltage outputted as a detected voltage; and
  feedback means connected between the first terminal of the input FET and the gate of the bias current FET for negatively feeding back the detected voltage to the gate of the bias current FET.

Here, the FET buffer amplifier may further comprise a second resistor connected between the second terminal of the input FET and the first terminal of the bias current FET, and a third resistor connected between the second terminal of the bias current FET and the second voltage source, the second and third resistors accommodating variations in characteristics of the input FET and the bias current FET.

The FET buffer amplifier may further comprise a cascode transistor connected between the first terminal of the input FET and the detection resistor.

The feedback means may be a capacitor.

The present invention detects the fluctuation of the source current flowing through the input FET by the detection resistor connected between the input FET and the first voltage source. Here, the fluctuation of the source current is detected in the form of a voltage corresponding to the load current, and the detected voltage is negatively fed back to the gate of the bias current FET. Thus, the source current of the bias current FET is adjusted so as to maintain the source current of the input FET at a fixed current, thereby maintaining the difference between the input voltage and the output voltage of the buffer amplifier at a fixed value. This means that the gain of the buffer amplifier approaches unity, and the output impedance approaches zero.

The above and other objects, effects, features and advantages of the present invention will become more apparent from the following description of the embodiments thereof taken in conjunction with the accompanying drawings.

BRIEF DESCRIPTION OF THE DRAWINGS

FIGS. 7A–7H are diagrams illustrating waveforms of various portions of the FET buffer amplifier of the second embodiment.

DETAILED DESCRIPTION OF PREFERRED EMBODIMENTS

The invention will now be described with reference to the accompanying drawings.

Figure 4:
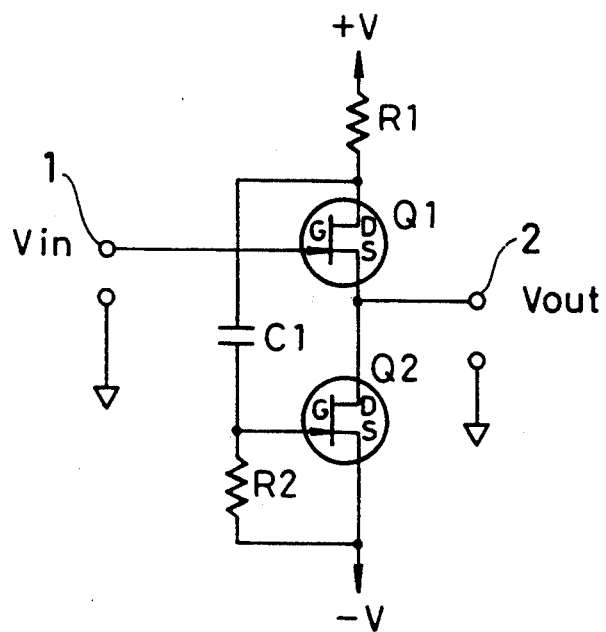
FIG. 4 is a circuit diagram showing an arrangement of an FET buffer amplifier as a first embodiment of the present invention.

FIG. 4 is a circuit diagram showing an arrangement of a first embodiment of a buffer amplifier of the present invention.

In FIG. 4, an input FET Q1 and a bias current FET Q2 have substantially the same characteristic. The input FET Q1 is a source follower circuit whose voltage gain is approximately unity, and performs current amplification of an input signal. On the other hand, the bias current FET Q2 operates as a current source that supplies the input FET Q1 with a bias current.

A resistor R1 connected between the drain of the input FET Q1 and a reference voltage source +V is a load current detection resistor for detecting the fluctuation of the source current or drain current of the input FET Q1 by converting it into a voltage. The fluctuation of the source current corresponds to that of a load current induced by the fluctuation of the input signal. The detected voltage $V_{R1}$ by the resistor R1 is negatively fed back to the gate of the bias current FET Q2 via a capacitor C1. A resistor R2 connected between the gate and source of the bias current FET Q2 is a bias resistor for applying a bias voltage to the bias current FET Q2.

The operation of the first embodiment is substantially the same as that of a second embodiment described below, and so the explanation thereof is omitted here.

Figure 5:
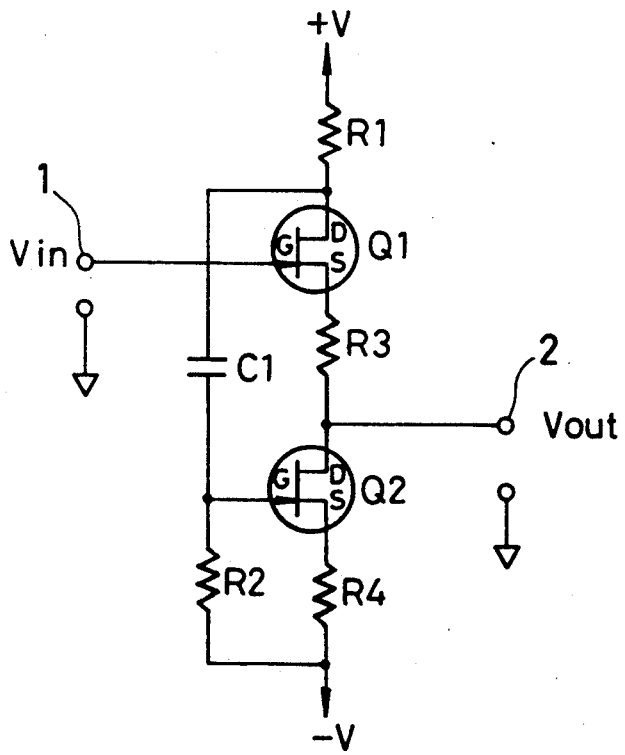
FIG. 5 is a circuit diagram showing an arrangement of an FET buffer amplifier as a second embodiment of the present invention.

FIG. 5 is a circuit diagram showing an arrangement of a buffer amplifier as a second embodiment of the present invention. The second embodiment is different from the first embodiment in that resistors R3 and R4 are provided to accommodate variations in FETs. More specifically, the resistor R3 is connected between the source of the input FET Q1 and the drain of the bias current FET Q2, and the resistor R4 is connected between the source of the bias current FET Q2 and the voltage source $-V$. Thus, the effect of variations of the characteristic of the drain-to-source current $I_{DSS}$ on the bias current, i.e., on the source current of the bias current FET Q2 when the gate and source thereof is connected can be reduced. In particular, the resistor R4 serves to reduce the offset voltage across the input and output terminals 1 and 2 caused by variations in the characteristics of the input FET Q1 and bias current FET Q2. The resistances of these resistors are commonly specified as R3=R4.

Examples of resistances of the resistors and a capacitance of the capacitor are as follows: R1=220 Ω; C1=0.1 μF; R2=1 kΩ; R3=R4=47 Ω. The mutual conductances $g_{m1}$ and $g_{m2}$ of the FETs Q1 and Q2 are about 5 mS.

FIGS. 7A–7H are diagrams illustrating waveforms of various portions of the second embodiment. In these figures, $\Delta I_{RL}$ is a fluctuation amount of a load current $I_{RL}$, $\Delta I_{Q2}$ is a fluctuation amount of the drain current $I_{Q2}$ of the bias current FET Q2, and $\Delta I_{Q1}$ is a fluctuation amount of the drain current $I_{Q1}$ of the input FET Q1.

When the input voltage Vin whose magnitude is nonzero is applied to the input FET Q1 as shown in FIG. 7A, the output voltage Vout is produced as shown in FIG. 7B. In this state, the load current $I_{RL}$ flows as shown in FIG. 7C, and the source current or the drain current $I_{Q1}$ of the input FET Q1 changes by the amount $\Delta I_{Q1}$ as shown in FIG. 7E. This change induces a voltage $V_{R1}$ across the resistor R1 as shown in FIG. 7F. This voltage, that is, the detected voltage $V_{R1}$ is negatively fed back to the gate of the bias current FET Q2 via the capacitor C1, as shown in FIG. 7G. Therefore, the bias current $I_{Q2}$ produced by the bias current FET Q2 is varied by $V_{R1} \times g_m$, thereby producing the fluctuation of $\Delta I_{Q2}$ as shown in FIG. 7D. As a result, the fluctuation $\Delta I_{Q1}$ of the drain or source current of the input FET Q1 is expressed as follows:

$$\Delta I_{Q1} = \Delta I_{RL} + \Delta I_{Q2}$$

where $\Delta I_{RL}$ is a fluctuation of the load current $I_{RL}$.

The fluctuation $\Delta I_{Q2}$ is induced in the direction to cancel the fluctuation $\Delta I_{RL}$, as shown in FIGS. 7C and 7D, and hence, the fluctuation $\Delta I_{Q1}$ of the drain current of the input FET Q1 is greatly reduced as shown in FIG. 7E. Thus, the voltage reduction induced by the resistor R3 and the source resistance of the FET Q1 is reduced to a very small amount.

In this case, the value of an output resistance Rout is expressed as $R_{out} \approx$ (R2 + source resistance of Q1)/{1 +

R1/(R4 + source resistance of Q2)}

Figure 1:
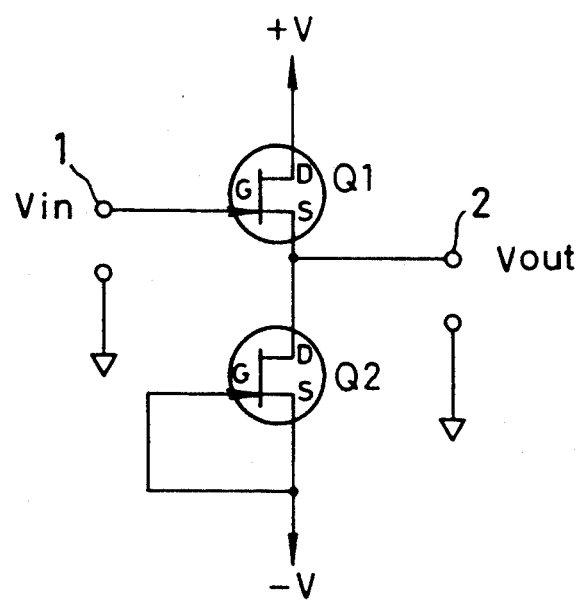
FIG. 1 is a circuit diagram showing an arrangement of a conventional buffer amplifier.
Figure 2:
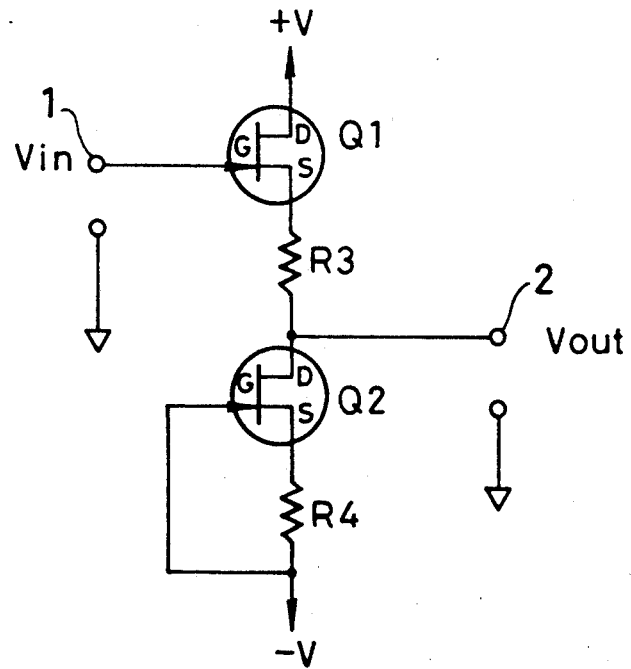
FIG. 2 is a circuit diagram showing an arrangement of another conventional buffer amplifier.
Figure 3:
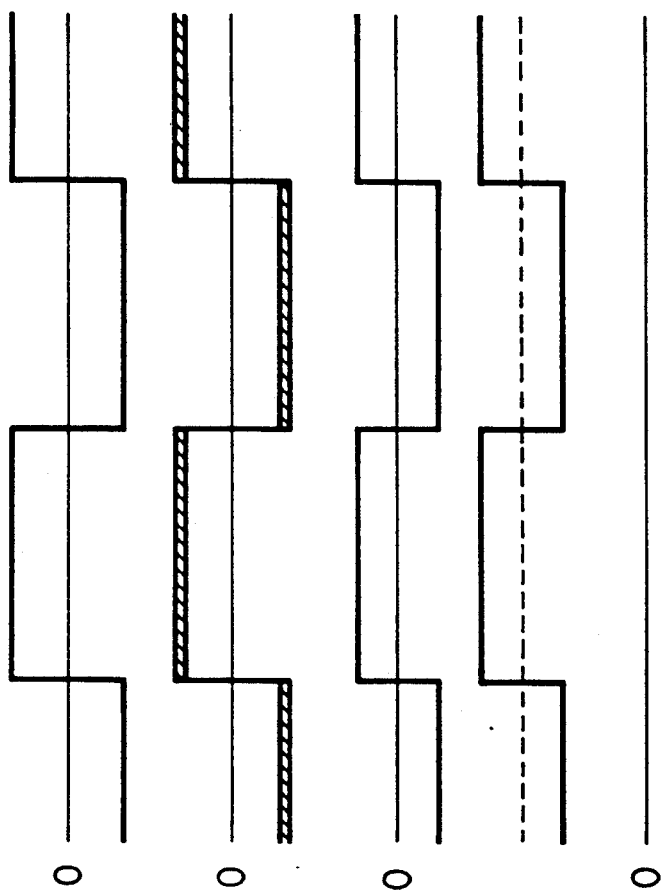
FIGS. 3A–3D are diagrams illustrating waveforms of various portions of the buffer amplifier shown in FIG. 2.

In the example of FIG. 2, the value Rout is approximately 100 Ω, resulting in reduction to about a half of the conventional value.

Incidentally, in FIGS. 7A–7H, the detection sensitivity of the load current $I_{RL}$ is set low to enlarge the fluctuation $\Delta I_{Q1}$ of the drain current of the input FET Q1 as shown in FIG. 7E to help understanding. In practice, however, by increasing the detection sensitivity and the mutual conductance $g_m$ of the bias current FET Q2, the fluctuation $\Delta I_{Q1}$ of the drain current of the input FET Q1 is reduced, and hence, the input voltage Vin can be made substantially equal to the output voltage Vout.

Figure 6:
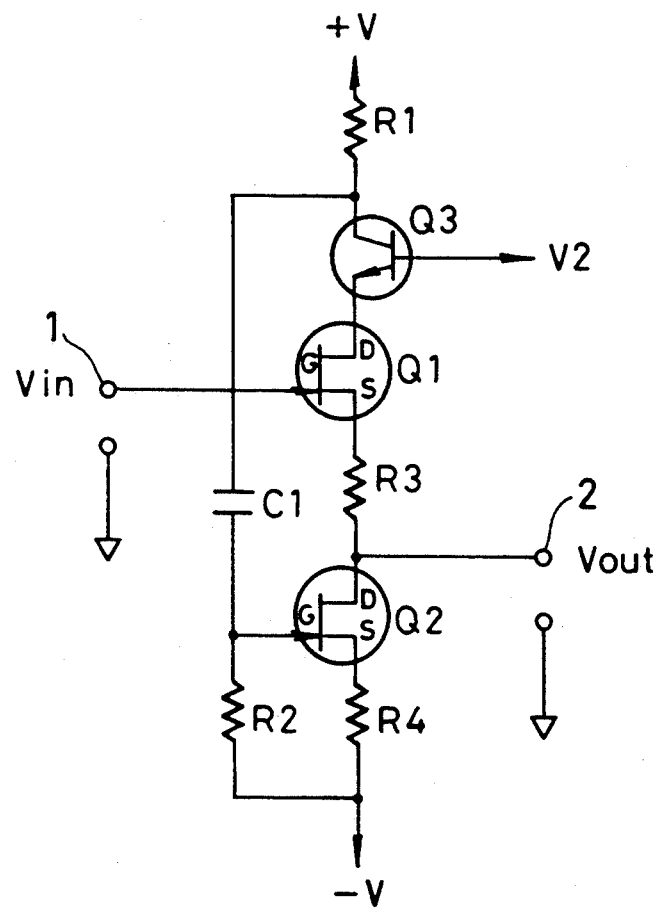
FIG. 6 is a circuit diagram showing an arrangement of an FET buffer amplifier as a third embodiment of the present invention.

FIG. 6 is a circuit diagram showing an arrangement of a buffer amplifier as a third embodiment of the present invention. The third embodiment has a cascode circuit where a transistor Q3 is connected between the resistor R1 and the drain of the input FET Q1. This arrangement can prevent the degradation of the high frequency characteristic due to the Miller effect which the load current detection resistor R1 induces in the input FET Q1.

The invention has been described in detail with respect to various embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. A FET buffer amplifier comprising:
   a first voltage source;
   a second voltage source;
   an input terminal for receiving an input signal;
   an output terminal for producing an output signal;
   an input FET having a first terminal, a second terminal, and a gate terminal, said gate terminal of said input FET connected to said input terminal;
   a bias current FET having a first terminal, a second terminal and a gate terminal, said first terminal of said bias current FET connected to said second terminal of said input FET and to said output terminal, said second terminal of said bias current FET connected to said second voltage source, and said gate terminal of said bias current FET connected to said second voltage source via a first resistor;
   detection resistor means, connected between said first voltage source and said first terminal of said input FET, for detecting current flowing through said input FET, and for converting said current into a detected voltage;
   feedback means, connected between said first terminal of said input FET and said gate terminal of said bias current FET, for negatively feeding back said detected voltage to said gate terminal of said bias current FET; and
   second resistor means, connected between said second terminal of said input FET and said first terminal of said bias current FET; and
   third resistor means, connected between said second terminal of said bias current FET and said second voltage source, said second and third resistor means for accommodating variations in characteristics of said input FET and said bias current FET.

2. A FET buffer amplifier comprising:
   a first voltage source;
   a second voltage source;
   an input terminal for receiving an input signal;
   an output terminal for producing an output signal;
   an input FET having a first terminal, a second terminal, and a gate terminal, said gate terminal of said input FET connected to said input terminal;
   a bias current FET having a first terminal, a second terminal and a gate terminal, said first terminal of said bias current FET connected to said second terminal of said input FET and to said output terminal, said second terminal of said bias current FET connected to said second voltage source, and said gate terminal of said bias current FET connected to said second voltage source via a first resistor;
   detection resistor means, connected between said first voltage source and said first terminal of said input FET, for detecting a current flowing through said input FET, and for converting said current into a detected voltage;
   feedback means, connected between said first terminal of said input FET and said gate terminal of said bias current FET, for negatively feeding back said detected voltage to said gate terminal of said bias current FET; and
   a cascode transistor connected between said first terminal of said input FET and said detection resistor means.

3. A FET buffer amplifier comprising:
   a first voltage source;
   a second voltage source;
   an input terminal for receiving an input signal;
   an output terminal for producing an output signal;
   an input FET having a first terminal, a second terminal, and a gate terminal, said gate terminal of said input FET connected to said input terminal;
   a bias current FET having a first terminal, a second terminal and a gate terminal, said first terminal of said bias current FET connected to said second terminal of said input FET and to said output terminal, said second terminal of said bias current FET connected to said second voltage source, and said gate terminal of said bias current FET connected to said second voltage source via a first resistor;
   detection resistor means, connected between said first voltage source and said first terminal of said input FET, for detecting a current flowing through said input FET, and for converting said current into a detected voltage;
   feedback means, connected between said first terminal of said input FET and said gate terminal of said bias current FET, for negatively feeding back said detected voltage to said gate terminal of said bias current FET, wherein said feedback means is a capacitor; and
   second resistor means, connected between said second terminal of said input FET and said first terminal of said bias current FET; and
   third resistor means, connected between said second terminal of said bias current FET and said second voltage source, said second and third resistor means for accommodating variations in characteristics of said input FET and said bias current FET.

4. A FET buffer amplifier comprising:
   a first voltage source;
   a second voltage source;
   an input terminal for receiving an input signal;
   an output terminal for producing an output signal;
   an input FET having a first terminal, a second terminal, and a gate terminal, said gate terminal of said input FET connected to said input terminal;
   a bias current FET having a first terminal, a second terminal and a gate terminal, said first terminal of said bias current FET connected to said second terminal of said input FET and to said output terminal, said second terminal of said bias current FET connected to said second voltage source, and said gate terminal of said bias current FET connected to said second voltage source via a first resistor;
   detection resistor means, connected between said first voltage source and said first terminal of said input FET, for detecting a current flowing through said input FET, and for converting said current into a detected voltage;
   feedback means, connected between said first terminal of said input FET and said gate terminal of said bias current FET for negatively feeding back said detected voltage to said gate terminal of said bias current FET, wherein said feedback means is a capacitor; and
   a cascode transistor connected between said first terminal of said input FET and said detection resistor means.

* * * * *